(12) United States Patent
Kamijima (10) Patent No.: US 6,509,275 B1
(45) Date of Patent: Jan. 21, 2003

(54) METHOD OF MANUFACTURING THIN FILM AND PRETREATING METHOD THEREOF

(75) Inventor: Akifumi Kamijima, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/413,251

(22) Filed: Oct. 7, 1999

(30) Foreign Application Priority Data

Oct. 9, 1998 (JP) .......................................... 10-288519

(51) Int. Cl.[7] ............................................. H01L 21/302
(52) U.S. Cl. ...................... 438/704; 438/706; 438/711; 438/714; 438/725; 438/727; 438/730; 438/745; 438/749; 438/3; 438/484; 438/490; 438/457; 438/585; 438/677; 438/678; 438/906; 438/974; 427/129; 427/299; 427/444
(58) Field of Search ................................ 438/704, 706, 438/711, 714, 725, 727, 730, 745, 749, 153, 3, 484, 490, 497, 585, 677, 678, 906, 974; 427/129, 299, 444; 148/DIG. 17; 134/3, 26–30, 34, 36, 41; 29/603.01, 603.07, 603.13

(56) References Cited

U.S. PATENT DOCUMENTS

| | | | | |
|---|---|---|---|---|
| 3,813,991 A | * | 6/1974 | Rich .............................. | 91/31 |
| 3,821,947 A | * | 7/1974 | Schossow | |
| 4,440,971 A | * | 4/1984 | Harrold ........................ | 174/17 |
| 4,643,351 A | * | 2/1987 | Fukamachi et al. ............ | 236/44 |
| 4,749,440 A | * | 6/1988 | Blackwood et al. ......... | 156/646 |
| 5,103,763 A | * | 4/1992 | Goldowsky et al. ......... | 118/624 |
| 5,143,750 A | * | 9/1992 | Yamagata et al. ............. | 427/57 |
| 5,294,568 A | * | 3/1994 | McNelly et al. | |
| 5,503,708 A | * | 4/1996 | Koizumi et al. .......... | 156/643.1 |
| 5,879,576 A | * | 3/1999 | Wada et al. ................... | 216/91 |
| 5,888,906 A | * | 3/1999 | Sandhu et al. .............. | 438/706 |
| 6,024,888 A | * | 2/2000 | Watanabe et al. .............. | 216/73 |
| 6,235,641 B1 | * | 5/2001 | Christenson ................. | 438/706 |
| 6,249,933 B1 | * | 6/2001 | Bergman ...................... | 134/1.3 |

FOREIGN PATENT DOCUMENTS

JP 1-119685 5/1989

* cited by examiner

Primary Examiner—Matthew Smith
Assistant Examiner—V. Yevsikov
(74) Attorney, Agent, or Firm—Oliff & Berridge, PLC (57) ABSTRACT

In pre-treating a surface of a substrate in a process of forming a narrowed thin film pattern on the surface of the substrate from a solution such as a plating liquid, a mask with an opening corresponding to the thin film pattern to be formed later is formed on the surface of the substrate. Then, by micronizing a pre-treating liquid such as a water, a plating liquid, an acidic liquid ad an alkaline liquid, an atmosphere containing microparticles having diameters smaller than the minimum distance of the opening of the mask is produced. The substrate is positioned into the atmosphere, and the microparticles of the pre-treating liquid are stuck on the surface of the substrate exposing to the lower part of the opening of the mask. In using a water as the pre-treating liquid, the substrate is positioned into an atmosphere containing moisture vapor and the water particles are stuck on the surface of the substrate through their condensation. Or the substrate is positioned into an atmosphere containing water microparticles produced by aerifying a water through supersonic vibration and the microparticles are stuck on the surface of the substrate through their precipitation. Thereby, the microparticles of the pre-treating liquid can be stuck in the minute opening of the mask and the damage of the mask pattern due to the pre-treating liquid can be avoided.

23 Claims, 7 Drawing Sheets

METHOD OF MANUFACTURING THIN FILM AND PRETREATING METHOD THEREOF

BACKGROUND OF THE INVENTION

1. Field of the Invention

This invention relates to a thin film-forming method whereby a thin film having good qualities can be obtained by enhancing a wettability of a surface of a substrate through the pretreatment of the surface of the substrate before the thin film is formed on the surface of the substrate from a liquid, more particular a pre-treating method in such a thin film forming method.

2. Related Art Statement

A typical process to grow a thin film from a liquid is a plating method. In the plating treatment, for developing the quality of the thin film formed by the plating, for example, a surface of a substrate on which the thin film is formed is pre-treated through the cleaning the surface with a water, an acidic liquid or an alkaline liquid before the plating treatment. Moreover, in forming the thin film alongside a given pattern, a mask having an opening with a given pattern such as a resist frame is formed on the surface of the substrate on which the thin film is formed and thereafter, the surface of the substrate is pre-treated. Then, the thin film having a given pattern is formed in the opening of the mask.

The method is conventionally known as the pretreatment method, for example, that a substrate for a thin film to be formed is dipped into a pre-treating liquid or a pre-treating liquid is sprayed onto a surface of a substrate by a spray. For example, Kokai publication No. 1-119685 discloses the pre-treating process containing acidic liquid wash, acidic liquid wash rinse, mist spray and plating-after-rinse, successively, in a continuous plating line of steel ribbon. In this case, a dipping method is used for the acidic liquid wash, the acidic liquid wash rinse and the plating-after-rinse, and a method to spray water is used for the mist spray.

Although in a technical field requiring a high accuracy and a fine plating pattern such as an IC, an LSI and thin film magnetic head, a mask having an opening to define a plating pattern, the width of the opening in the mask become very small. For example, although a width of a magnetic pole of a writing thin film magnetic head is narrowed to about 1 $\mu$m for enhancing a recording density, the width is tended to be much narrowed. Thus, in forming the magnetic pole by plating a magnetic material, the opening width of the frame to define the plating pattern is narrowed corresponding to the narrowing of the pole width. Even though the pole width is narrowed, the aspect ratio (the height of the opening/the width of the opening) is made large for maintaining the plating film thick to some degree.

Thus, in the conventional pre-treating method, the pre-treating liquid strides the opening due to its surface tension, etc., so that the liquid can not be sometimes stuck on a surface to be plated located on the bottom surface of the frame opening. Moreover, since the pre-treating liquid closes the frame opening, pores remain in the opening, resulting in the interiors of the pores being not plated.

The resist frame itself has a large aspect ratio due to the narrowing of the plating pattern. Thus, in spraying the pre-treating liquid with a spray, particularly, the resist frame suffers from a large dynamic damage, resulting in the destruction of the resist frame. Moreover, when the pre-treating liquid is exhausted to outside from the frame opening, the resist frame is damaged from its surface tension.

SUMMARY OF THE INVENTION

It is an object of the present invention to provide a pre-treating method suitable for forming a narrowed thin film pattern precisely.

It is another object of the present invention to provide a pre-treating method for forming a thin film which can minimize a damage to a resist frame.

It is still another object of the present invention to provide a pre-treating method suitable for automation.

Moreover, this invention relates to a method for forming a thin film, from a liquid, on a pre-treated surface of a substrate, and it is further object of the present invention to provide a thin film-forming method capable of forming a high quality thin film precisely.

A pre-treating method in a thin film-forming process according to the present invention comprising the steps of:

forming, on a surface of a substrate on which a thin film pattern is formed, a mask having a pattern to define a thin film-forming area having a pattern corresponding to the thin film pattern, producing an atmosphere containing microparticles of a pre-treating liquid produced by micronizing a pre-treating liquid so as to have the diameters at least smaller than the minimum distance of the mask pattern, and positioning the substrate into the atmosphere containing the microparticles of the pre-treating liquid and thereby sticking the microparticles on the thin film-forming.

In this invention, by positioning the substrate on which the thin film is formed in the atmosphere containing the floating microparticles of the pre-treating liquid and sticking the microparticles of the pre-treating liquid within the thin film-forming area on the substrate, the thin film-forming area has good wettability and good surface condition whereby it is easy for the material constituting the thin film to be deposited when the thin film is formed from the liquid. Consequently, the high quality thin film can be formed. The pre-treating liquid has the microparticles having the smaller diameters than the minimum distance of the mask pattern and the microparticles are stuck on the thin film-forming area. Thus, even though in a technical field requiring a precise and fine thin film pattern in an IC, an LSI, a thin film magnetic head and so on, the aspect ratio of the mask opening become large due to the narrowing of the thin film pattern, the microparticles of the pre-treating liquid can be stuck on the thin film-forming surface located in the bottom surface of the opening. Thus, unlike the conventional technique, the improper problem does not occur that the opening is closed by the sticking of the pre-treating liquid at the mask opening or pores remain in the opening. Consequently, a high quality thin film can be formed.

Furthermore, since the microparticles of the pre-treating liquid float freely in the atmosphere in which the substrate is positioned, unlike the conventional spray method, the pre-treating method according to the present invention can minimize the dynamic damage for the resist frame. Thus, even if a mask having a large aspect ratio opening is employed for narrowing the thin film pattern, the destruction of the mask can be avoided. Moreover, the mask does not suffer from the damage due to the surface tension generated by the exhaust of the pre-treating liquid to outside from between the frame.

In carrying out the pre-treating method according to the present invention, the atmosphere may be made of a pre-treating liquid containing gas molecules, aerified liquid microparticles, or both the gas molecules and the liquid microparticles.

In a preferred embodiment of the pre-treating method according to the present invention, the pre-treating liquid is composed of a water and the atmosphere contains its moisture vapor. Then, the water particles are adhered to gas molecules through their condensation. Since the moisture vapor is a gas containing water molecules, in thin case, the above microparticles of the pre-treating liquid means the water molecules. In this way, in using the moisture vapor as the microparticles of the pre-treating liquid, the temperature of the atmosphere containing the moisture vapor is preferably 200° C. and over for protecting the heat damage. Moreover, when the temperature of the atmosphere containing the moisture vapor is 100° C. and below, the relative humidity is preferably not less than 100%.

In another preferred embodiment of the pre-treating method according to the present invention, using water as the pre-treating liquid, the substrate is positioned in the atmosphere containing water microparticles obtained by aerifying the water as the pre-treating liquid and the aerified water microparticles are stuck on the surface of the substrate. In this case, the aerifying is preferably carried out by supersonic vibrating the water. Although at least the part of the atmosphere containing the water microparticles normally is composed of a moisture vapor, its amount is not much, different from the case of the pretreatment by moisture vapor.

In still another preferred embodiment of the pre-treating method according to the present invention, the pre-treating liquid is made of an acidic liquid or an alkaline liquid and the atmosphere contains the microparticles produced by aerifying the acidic liquid or the alkaline liquid. The acidic liquid or the alkaline liquid may be easily aerified by supersonic vibration. Moreover, the atmosphere may contain the microparticles as gas molecules from almost all acidic liquids or an alkaline liquid like ammonia. Furthermore, the atmosphere may contain gas molecules from an alcohol such as ethanol.

In the pre-treating method according to the present invention, some of the above water-treatment, the plating liquid-treatment, the acidic liquid-treatment and the alkaline liquid-treatment are appropriately used. For example, a mask having a pattern to define a thin film-forming area having a pattern corresponding to a thin film pattern is formed on a surface of a substrate for the thin film to be formed, and thereafter, the substrate is positioned in an atmosphere containing water microparticles to stick water microparticles on the substrate. Then, the substrate is positioned in an atmosphere containing microparticles of an acidic liquid or an alkaline liquid to stick the acidic liquid-microparticles or the alkaline liquid-microparticles on the substrate, and thereafter, water microparticles are also stick on the substrate to remove the acidic liquid-particles or the alkaline liquid-particles. Subsequently, alkaline liquid- or acidic liquid-microparticles are stuck on the substrate in an atmosphere containing the microparticles, and water microparticles are stuck on the substrate in an atmosphere containing the water microparticles to remove the alkaline liquid- or the acidic liquid-microparticles. After the last water-treatment, a plating liquid-treatment may be carried out.

In the case of positioning a substrate in an atmosphere containing both of microparticles of a pre-treating liquid and gas molecules produced by evaporizing a pre-treating liquid, the microparticles and the gas molecules may be made of the same pre-treating liquid or different pre-treating liquids. For example, the atmosphere may be made of moisture vapor microparticles and microparticles generated by aerifying an acidic liquid.

This invention relates to a method for forming a thin film having a given pattern on a surface of a substrate. In the forming method, the above pretreatment is performed on the substrate and thereafter, a thin film may be formed from a solution on the surface of the substrate in the condition that the substrate surface is wet by the pretreatment. In this case, for preventing the pre-treating liquid on the substrate surface from evaporating, water current may be flowed very weakly on the wet substrate surface by the pretreatment. Although the thin film can be made from the solution by various method, it may be preferably formed from a plating liquid. In this case, the plating may be carried out by electroplating or electroless plating.

As mentioned above, since the vaporization of the pre-treating liquid by heating and the aerification of the pre-treating liquid by an aerifying equipment utilizing supersonic vibration can control easily the diameters of the microparticles produced and the content of the microparticles in the atmosphere, the pre-treating method suitable for automation can be provided.

BRIEF DESCRIPTION OF THE DRAWINGS

For a better understanding of this invention, reference is made to the attached drawings, wherein:

FIGS. 1–9 are views showing successive steps of a thin film-forming method including a first embodiment of the pre-treating method according to the present invention, FIG. 10 is a flow chart showing a second embodiment of the pre-treating method according to the present invention, FIG. 11 is a flow chart showing a third embodiment of the pre-treating method according to the present invention, FIG. 12 is a flow chart showing a forth embodiment of the pre-treating method according to the present invention, FIG. 13 is a flow chart showing a fifth embodiment of the pre-treating method according to the present invention, and FIG. 14 is a flow chart showing a sixth embodiment of the pre-treating method according to the present invention.

DETAILED DESCRIPTION OF PREFERRED EMBODIMENTS

FIGS. 1–9 are views showing successive steps of a thin film-forming method including a first embodiment of the pre-treating method according to the present invention. In this embodiment, although a thin film is formed through electroplating, the pre-treating method of the present invention may be widely applied for a pre-treating method in a thin film-forming process of growing the thin film from a solution.

First of all, as shown in FIG. 1, a plating underfilm 10 is formed on a surface of a substrate 1 on which a thin film is to be formed, and resist frames 21 and 22 to define a thin film-forming area 12 are formed on the surface 11 of the underfilm. The resist frames 21 and 22 are formed so as to have a given pattern by photolithography, etc. A material constituting the resist frames 21 and 22 is not restricted if the material is a photoresist material. The resist frames 21 and 22 are positioned by a distance W1, each other. Hereinafter, the distance W1 is called as a "minimum frame distance". This embodiment will be explained, suppose that the minimum frame distance is 1–5 μm. Each of the resist frames 21 and 22 has a height H1 and a width d1. In FIG. 1, the resist frames 21 and 22 are separate, each other, but it may be composed of a continuous single resist frame. In this case, the minimum frame distance is regarded as a minimum width of an opening formed in the resist frame. In this embodiment, since the substrate is made of an electric insulating material, a conductive seed layer is provided on the surface of the substrate. If the substrate itself is made of a conductive material, such a plating underfilm may not be formed. The resist frame are formed on the surface of the plating underfilm 10.

Figure 2:
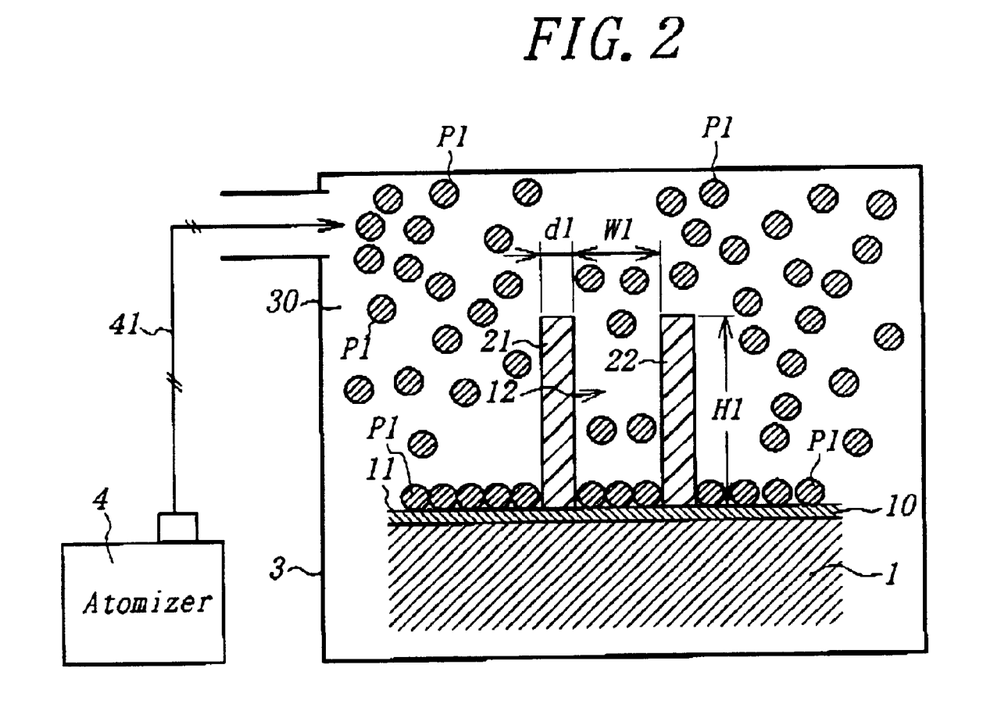

Then, as shown in FIG. 2, in a treating bath is formed, on floating, an atmosphere containing microparticles p1 obtained by micronizing a pre-treating liquid into the smaller diameters than the minimum frame distance W1 in the thin film-forming area 12, and in the treating bath is positioned the substrate 1. In this specification, the microparticles p1 means not only microparticles obtained by aerifying the pre-treating liquid, but also vapor molecules obtained by evaporating the pre-treating liquid. The atmosphere is formed in the interior space 30 of the treating bath, so it is denoted as the same numeral "30".

Figure 3:
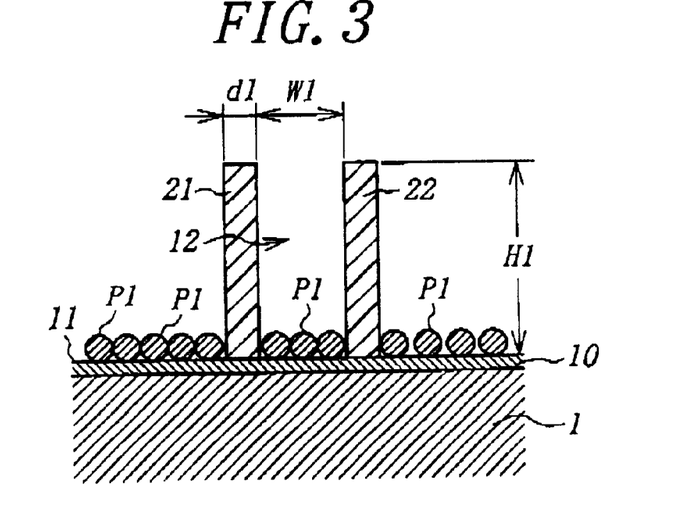

The pre-treating liquid is micronized by a micronizing equipment 4. The thus obtained microparticles p1 are supplied with the atmosphere 30 constituted by the interior space of the treating bath 3 via tube 41. The substrate 1 is positioned in the atmosphere 30 and the microparticles P1 of the pre-treating liquid are stuck on the thin film-forming area 12. Thereby, in the thin film-forming area 12, the wettability of the surface of the plate-underfilm 10 to be plate-sticking surface is enhanced, and it is easy to plate on the surface. FIG. 3 shows schematically the state in which the microparticles are stuck inside and outside the resist frames 21 and 22.

Moisture vapor particles are exemplified as the microparticles of the pre-treating liquid. In this case, the water droplets are stuck on the thin film-forming area 12 by condensation. The moisture vapor can be easily obtained by heating a water. Moreover, as the microparticles P1 of the pre-treating liquid, water microparticles obtained by aerifying a water are exemplified. The aerification may be easily performed by supersonic vibrating a water. Needless to say, in the moisture vapor, the size of each water molecule is smaller than the minimum frame distance W1, but in forming the microparticles through the aerification, the diameter of each aerified water microparticle is about 0.5 $\mu$m, which is smaller than the minimum frame distance W1 having a 1–5 $\mu$m distance. If the temperature of the atmosphere containing the moisture vapor as the microparticles of the pre-treating liquid is 200° C. and below, the resist frames 21 and 22 almost never suffer from the thermal damage. If the temperature of the atmosphere 30 containing the moisture vapor is less than 100° C., the relative humidity in the atmosphere is preferably 100% and over. In this way, for controlling the concentration of the microparticles in the atmosphere 30, an exhausting means is favorably connected to the treating bath 3.

As the pre-treating liquid, a plating liquid may be used. In this case, the atmosphere 30 contains the microparticles P1 of the plating liquid. The microparticles P1 of the plating liquid can be obtained by vibrating and aerifying the plating liquid with a micronizing equipment 4 such as a supersonic vibrating aerification equipment. In using the microparticles P1 of the plating liquid, the remaining of the microparticles P1 at plating does not matter.

As the pre-treating liquid, an acidic liquid may be employed. In this case, the atmosphere 30 contains the microparticles P1 of the acidic liquid. The microparticles P1 of the acidic liquid can be obtained by vibrating and aerifying the acidic liquid with a micronizing equipment 4 such as a supersonic vibrating aerification equipment. The microparticles P1 of the acidic liquid can acidic liquid-wash a surface to be plated effectively. The kind of the acidic liquid is varied, depending on the kind of the plating underfilm to be acidic liquid-washed. If the plating underfilm 10 is composed of a Cu film, etc., a hydrochloric acid or a sulfuric acid diluted to 0.1–10% may be employed. Moreover, gas molecules formed by vaporizing such an acidic liquid may be used.

The microparticles P1 of the pre-treating liquid may contain microparticles of an alkaline liquid. The microparticles of the alkaline liquid can be obtained by vibrating and aerifying the alkaline liquid. As the alkaline liquid, a conventional washing liquid to remove an oily component may be used. As the alkaline liquid are exemplified a sodium hydroxide, a potassium hydroxide, a sodium phosphate, tetramethylammonium hydroxide. In any case, the microparticles obtained by aerifying the alkaline liquid diluted to about 0.1–10% are employed. Although the alkaline liquid can not be vaporized for its use, an alkaline liquid like ammonia may be vaporized.

In this invention, the pre-treating liquid is micronized so as to contain the microparticles having the diameters smaller than the minimum frame distance W1 in the thin film-forming area 12. Thus, in a technical field requiring a precise and fine plating pattern in a IC, a LSI and a thin film magnetic head and so on, even though the aspect ratio (H1/W1) of the ratio of the frame height H1 to the minimum frame distance W1 is large for narrowing the plating pattern, the microparticles P1 of the pre-treating liquid can be certainly stuck on the surface 11 of the plating underfilm 10 constituting the bottom surface in the minimum frame distance W1. Accordingly, the sticking of the pre-treating liquid in the opening having the minimum frame distance W1, the close of the opening due to the sticking and remaining pores, which are conventional problems, are avoided. Consequently, a high quality plating film can be formed.

Since the atmosphere 30 containing the microparticles P1 of the pre-treating liquid is produced, the substrate 1 being set into the atmosphere 30, and the microparticles P1 of the pre-treating liquid are stuck on the thin film-forming area 12, unlike the conventional spraying method, the resist frames 21 and 22 suffer from an only minimum dynamic damage. Thus, even if the resist frames 21 and 22 have the large aspect ratio (H1/d1) of the ratio of the frame height H1 to the frame width d1, respectively, the destruction of the resist frame 21 and 22 is prevented. When the pre-treating liquid is exhausted to outside from the minimum frame of the distance W1, etc., the resist frames 21 and 22 do not suffer from the surface tension damage.

As mentioned above, in the pre-treating process, the surface of the substrate is made wet through the sticking of the microparticles of the pre-treating liquid and thereafter, a thin film is formed on the surface by plating. In this case, the successive process of the pre-treating step and the plating step is suitable for automation, but the steps is not always carried out successively. In any case, the plating on the wet substrate surface enables a thin film having good qualities to be obtained. In the above successive process of the pre-treating step and the plating step, the pre-treating liquid may not dry. However, if the pre-treating liquid may dry before the plating step, a very weak water current may be flowed on the surface of the substrate before the pre-treating liquid dries.

Figure 4:
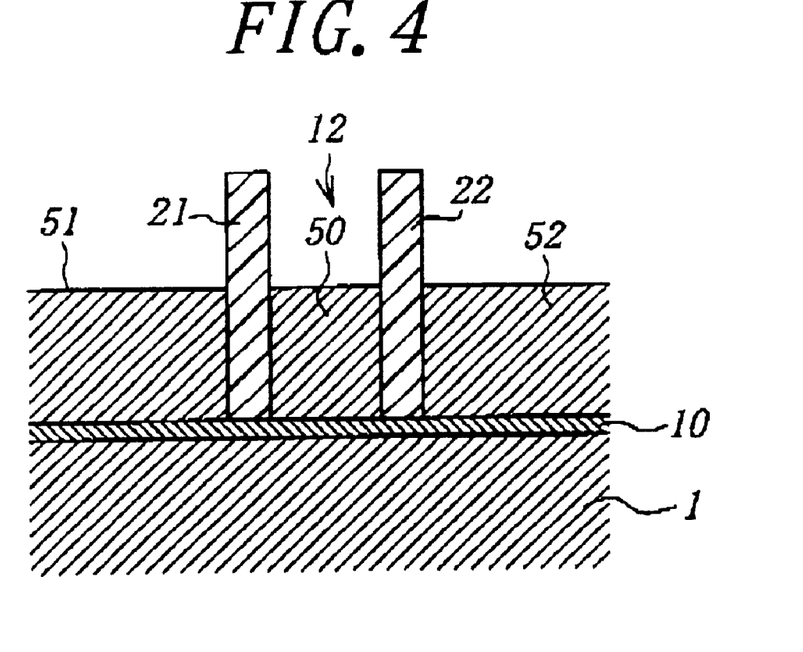

The plating may be carried out by a conventionally known process. For example, as shown in FIG. 4, plating films 50–52 are precipitated inside and outside the resist frames 21 and 22.

Figure 5:
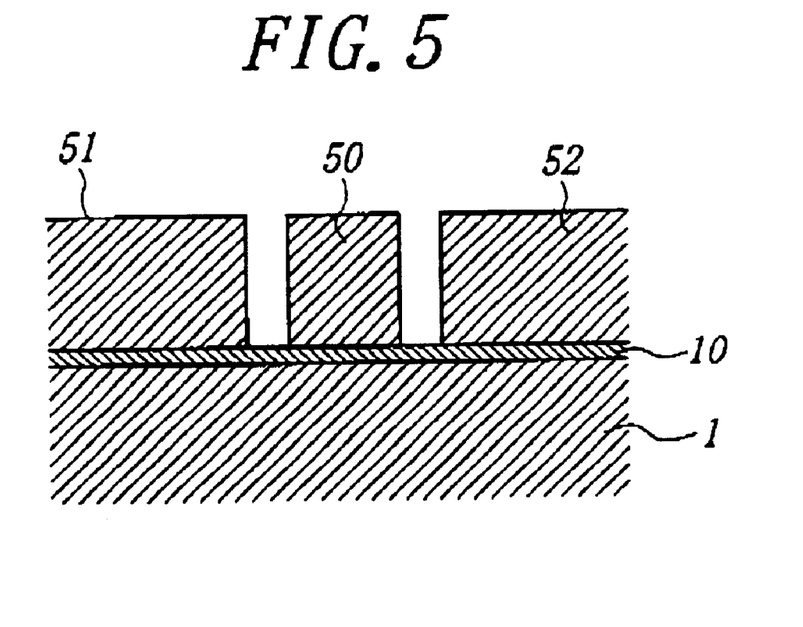
Figure 6:
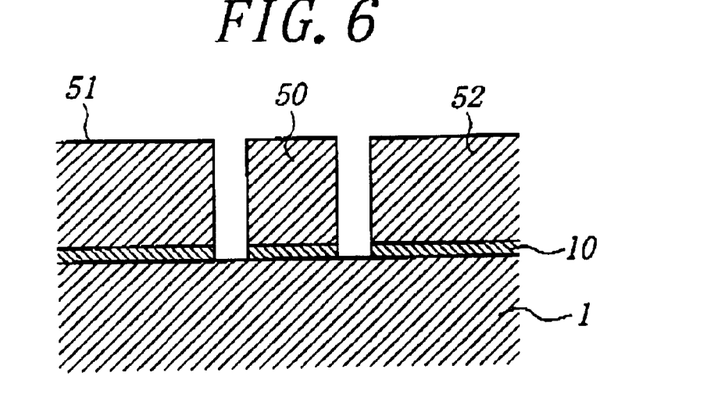

Next, as shown in FIG. 5, the resist frames 21 and 22 are peeled off with an organic solvent, etc. Subsequently, as shown in FIG. 6, with the plated film 50–52 as a mask, the plate-underfilm 10 exposed by removing the resist frames is selectively removed by ion-milling, etc.

Figure 7:
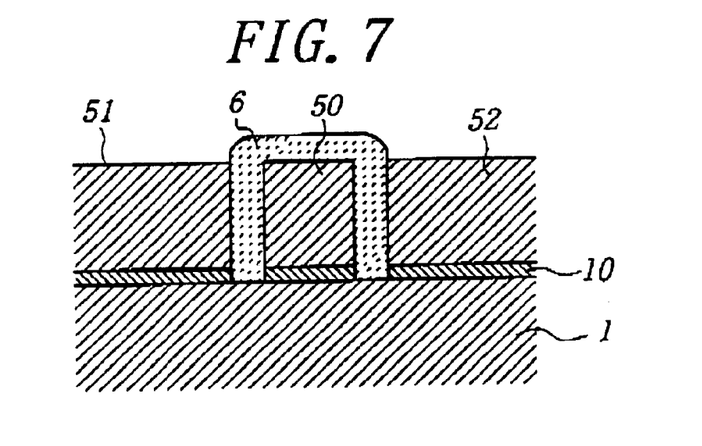
Figure 8:
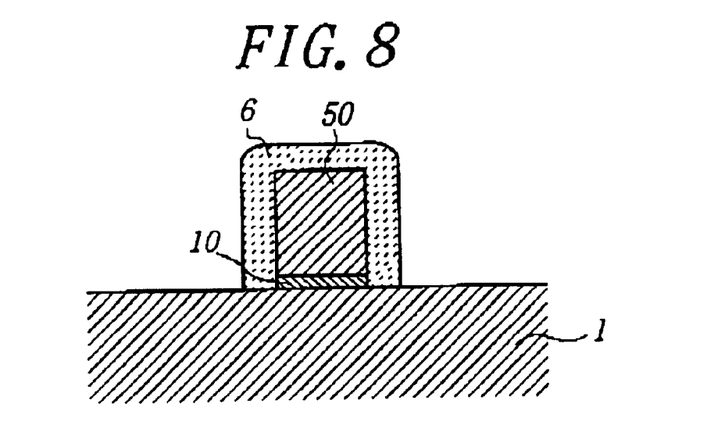
Figure 9:
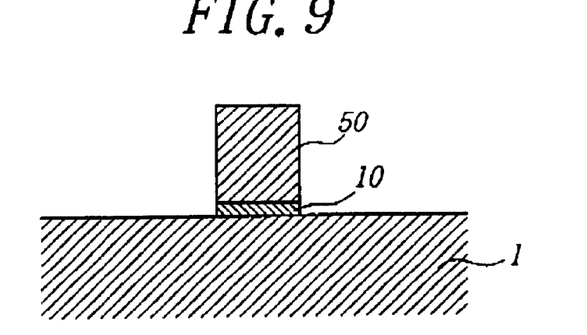

Next, as shown in FIG. 7, the top and the sides of the plated film 50 to be needed is covered with a resist pattern 6. Subsequently, as shown in FIG. 8, the plated films 51, 52 and the part of the plate-underfilm 10 outside the resist pattern 6 are removed by wet-etching, etc. and the resist pattern 6 is peeled off by an organic solvent, etc. Thereby, as shown in FIG. 9, only the plated film 50 having a requiring pattern remains.

Figure 1:
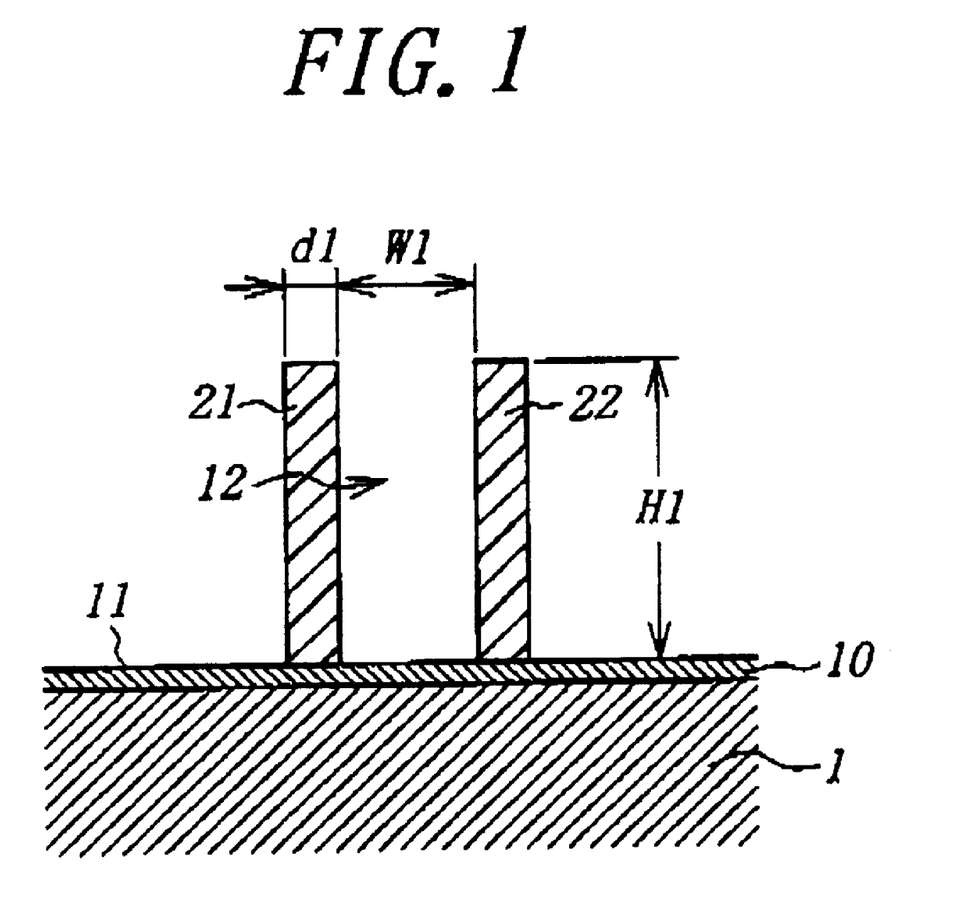

As the pre-treating liquid used in the pre-treating method are a water as above-mentioned, a plating liquid, an acidic liquid, or an acidic liquid and an alkaline liquid. FIGS. 10–14 are flow charts showing the pre-treating process using some of the above pre-treating liquid. Next, with reference to FIGS. 1 and 2, too, the flow charts of FIGS. 10–14 will be described.

Figure 10:
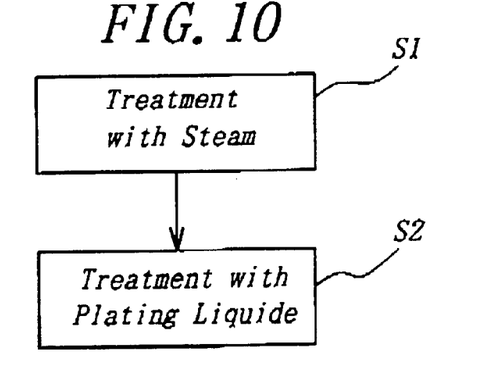

In a second embodiment shown in FIG. 10, the resist frames 21 and 22 to define the thin film-forming area 12 are formed on the surface of the substrate 1 to be plated and thereafter, moisture vapor-treated. In the moisture vapor treatment, the substrate 1 is set in the atmosphere 30 containing the moisture vapor, and water particles are stuck on the thin film-forming area 12 through condensation.

Subsequently, in the plating liquid treatment, the substrate 1 is positioned in the atmosphere 30 containing microparticles P1 of a plating liquid micronized into the smaller diameters than the minimum frame distance W1 in the thin film-forming area 12, and the microparticles P1 of the plating liquid are stuck on the thin film-forming area 12.

Figure 11:
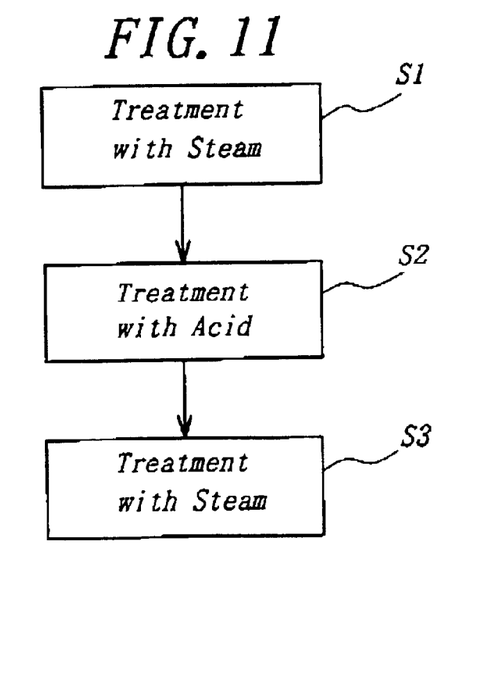

In a third embodiment shown in FIG. 11, the resist frames 21 and 22 to define the thin film-forming area 12 are formed and thereafter, moisture vapor-treated, so that water particles are stuck on the thin film-forming area 12 to be made wet.

Then, the substrate 1 is positioned in the atmosphere 30 containing microparticles P1 of an acidic liquid micronized into the smaller diameters than the minimum frame distance W1 in the thin film-forming area 12, and the microparticles P1 of the acidic liquid are stuck on the thin film-forming area 12. In this way, the surface of the plating underfilm 10 is acidic liquid-washed to have a surface condition easily to be plated.

Moreover, the substrate 1 is set in the atmosphere containing moisture vapor and water particles are stuck on the thin film-forming area 12 through their condensation to wash-removed (rinse) the acidic liquid.

Figure 12:
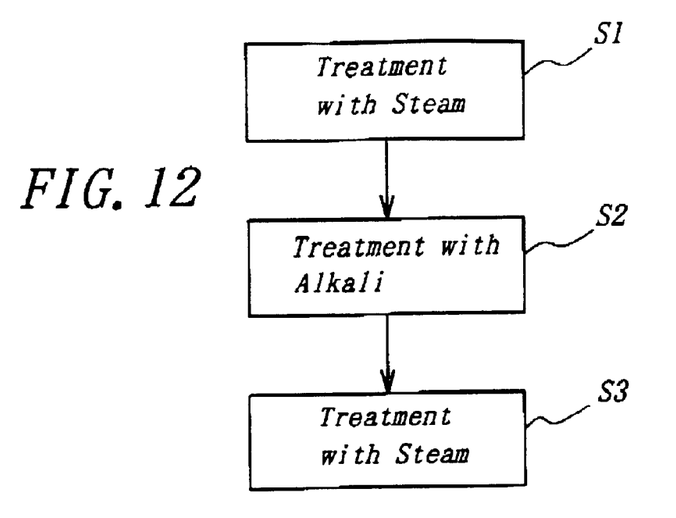

In a fourth embodiment shown in FIG. 12, the resist frames 21 and 22 to define the thin film-forming area 12 are formed and thereafter, moisture vapor-treated to stick water particles on the thin film-forming area 12 through their condensation.

Next, the substrate 1 is set in the atmosphere 30 containing micronized microparticles of an alkaline liquid, of which diameters are smaller than the minimum frame distance W1 in the thin film-forming area 12, and the microparticles of the alkaline liquid are stuck on the thin film-forming area 12. In this process, an oily component adhering particularly on the surface of the plating underfilm 10 in the thin film-forming area 12 is removed.

Moreover, the thin film-forming area 12 is moisture vapor-treated and water particles are stuck on the area 12 through their condensation to wash the alkaline liquid.

Figure 13:
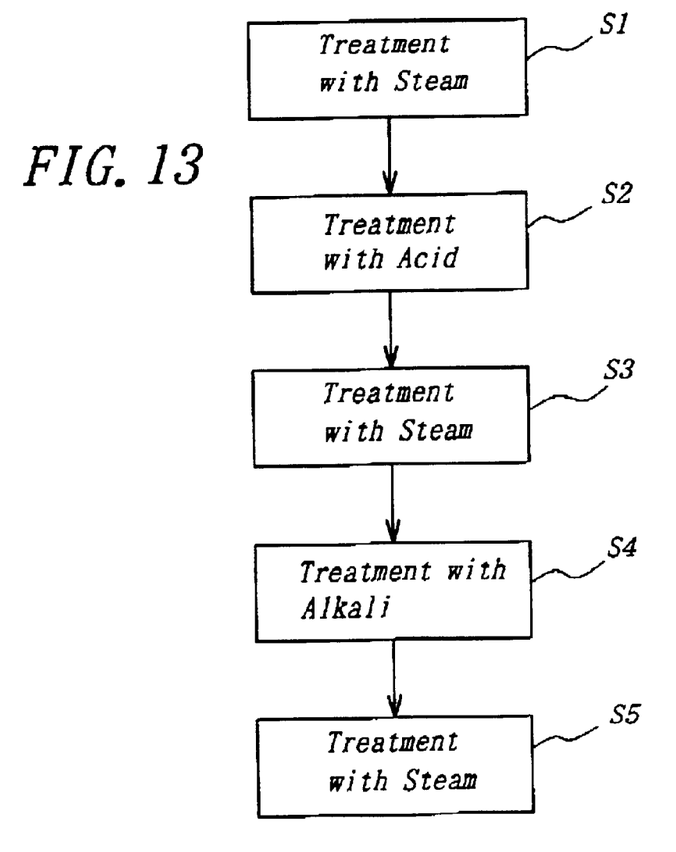

In a fifth embodiment shown in FIG. 13, the resist frames 21 and 22 to define the thin film-forming area 12 are formed and thereafter, moisture vapor-treated to wet the thin film-forming area 12 through the sticking of water particles.

Next, the substrate 1 is positioned in the atmosphere 30 containing microparticles P1 of an acidic liquid micronized into the smaller diameters than the minimum frame distance W1 in the thin film-forming area 12, and the microparticles P1 of the acidic liquid are stuck on the thin film-forming area 12. In this process, the surface of the plating underfilm 10 is acidic liquid washed and has a surface condition easily to be plated.

Subsequently, with another moisture vapor treatment, water particles are stuck on the thin film-forming area 12 through their condensation to wash-remove (rinse) the acidic liquid.

Next, the substrate 1 is set in the atmosphere 30 containing micronized microparticles of an alkaline liquid, of which diameters are smaller than the minimum frame distance W1 in the thin film-forming area 12, and the microparticles of the alkaline liquid are stuck on the thin film-forming area 12. In this process, an oily component adhering particularly on the surface of the plate-underfilm 10 in the thin film-forming area 12 is removed.

Moreover, the thin film-forming area 12 is moisture vapor-treated and water particles are stuck on the area 12 through their condensation to wash the alkaline liquid.

Figure 14:
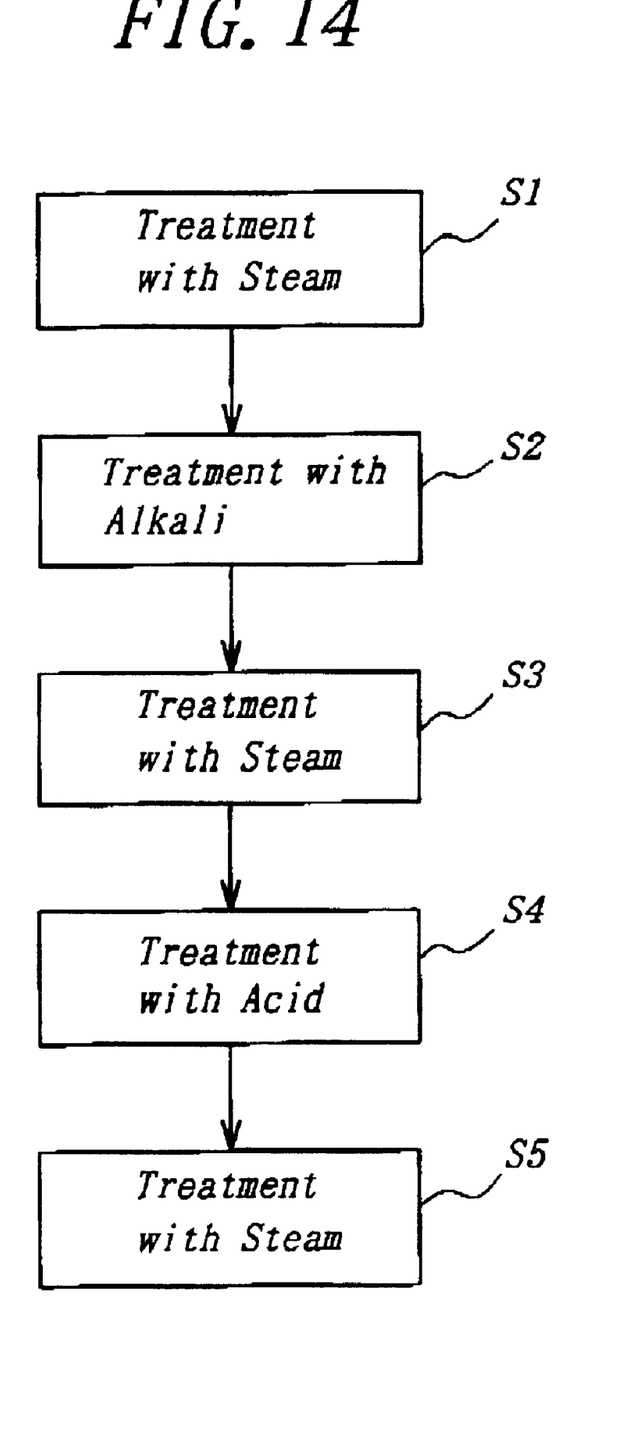

In a sixth embodiment shown in FIG. 14, the resist frames 21 and 22 to define the thin film-forming area 12 are formed and thereafter, moisture vapor-treated to wet the thin film-forming area 12 through the sticking of water particles.

Next, the substrate 1 is set in the atmosphere 30 containing micronized microparticles of an alkaline liquid, of which diameters are smaller than the minimum frame distance W1 in the thin film-forming area 12, and the microparticles of the alkaline liquid are stuck on the thin film-forming area 12. In this process, an oily component adhering particularly on the surface of the plate-underfilm 10 in the thin film-forming area 12 is removed.

Subsequently, the thin film-forming area 12 is moisture vapor-treated and water particles are stuck on the area 12 through their condensation to wash the alkaline liquid.

Next, the substrate 1 is positioned in the atmosphere 30 containing microparticles P1 of an acidic liquid micronized into the smaller diameters than the minimum frame distance W1 in the thin film-forming area 12, and the microparticles P1 of the acidic liquid are stuck on the thin film-forming area 12. In this process, the surface of the plate-underfilm 10 is acidic liquid washed and has a surface condition easily to be plated.

Finally, the substrate 1 is set in the atmosphere 30 containing moisture vapor and water particles are stuck on the thin film-forming area 12 through their condensation to wash-remove (rinse) the acidic liquid.

Not shown in the figures, the treatment cycle of the moisture vapor treatment, the acidic liquid treatment and the alkaline liquid treatment may be repeated. In the embodiments shown in FIGS. 10–14, instead of the moisture vapor treatment, a water-aerifying treatment may be used in which a water is aerified by supersonic vibrating and the thus obtained water microparticles are stuck on the substrate by positioning the substrate in an atmosphere containing the water particles. The microparticles of the plating liquid, the acidic liquid and the alkaline liquid are produced by supersonic vibrating. All the above treatments may be carried out in the same treating bath or different baths.

This invention is not limited to the above embodiments and every kind of variation and modification may be made without departing from the scope of the present invention. For example, in the above embodiments, although the mask to define the thin film pattern is composed of the photoresist frames, it may be a silicon oxide mask or a silicon nitride mask.

As above-mentioned, the following effects can be obtained, according to the present invention.

(a) The pre-treating method suitable for forming a narrowed thin film pattern can be provided.

(b) The pre-treating method for film-forming capable of avoiding a damage for a mask pattern like a resist frame can be provided.

(c) The pre-treating method capable of forming a high quality thin film can be provided.

(d) The pre-treating method suitable for automation can be provided.

What is claimed is:

1. A pre-treating method in a thin film-forming process comprising the steps of:

forming, on a surface of a substrate on which a thin film pattern is formed, a mask having a pattern to define a thin film-forming area having a pattern corresponding to the thin film pattern, producing an atmosphere containing microparticles of a pre-treating liquid produced by micronizing a pre-treating liquid so as to have the diameters at least smaller than the minimum distance of the mask pattern, and positioning the substrate into the atmosphere containing the microparticles of the pre-treating liquid and thereby sticking the microparticles on the thin film-forming.

2. A pre-treating method in a thin film-forming process as defined in claim 1, wherein the atmosphere contains the gas molecules of the pre-treating liquid.

3. A pre-treating method in a thin film-forming process as defined in claim 2, wherein the pre-treating liquid is a water and the atmosphere contains its moisture vapor.

4. A pre-treating method in a thin film-forming process as defined in claim 3, wherein the temperature of the atmosphere is 200° C. and below.

5. A pre-treating method in a thin film-forming process as defined in claim 4, wherein the temperature of the atmosphere is 100° C. and below and the relative humidity of the moisture vapor in the atmosphere is 100% and over.

6. A pre-treating method in a thin film-forming process as defined in claim 2, wherein the pre-treating liquid is a liquid selected from the group consisting of an acidic liquid, an alkaline liquid, an alcohol liquid and a plating liquid.

7. A pre-treating method in a thin film-forming process as defined in claim 1, wherein the atmosphere contains the liquid microparticles of the pre-treating liquid.

8. A pre-treating method in a thin film-forming process as defined in claim 7, wherein the pre-treating liquid is a water and the atmosphere contains its aerified water microparticles.

9. A pre-treating method in a thin film-forming process as defined in claim 7, wherein the pre-treating liquid is a plating liquid and the atmosphere contains the liquid particles produced by aerifying the plating liquid.

10. A pre-treating method in a thin film-forming process as defined in claim 7, wherein the pre-treating liquid is an acidic liquid and the atmosphere contains the liquid particles produced by aerifying the acidic liquid.

11. A pre-treating method in a thin film-forming process as defined in claim 7, wherein the pre-treating liquid is an alkaline liquid and the atmosphere contains the liquid particles produced by aerifying the alkaline liquid.

12. A pre-treating method in a thin film-forming process as defined in claim 7, wherein the liquid particles are produced through the aerification of the supersonic vibration of the pre-treating liquid.

13. A pre-treating method in a thin film-forming process as defined in claim 1, wherein the atmosphere contains the gas molecules and the liquid microparticles of the pre-treating liquid.

14. A pre-treating method in a thin film-forming process as defined in claim 13, wherein the pre-treating is a water and the atmosphere contains its vaporized moisture vapor and its aerified water microparticles.

15. A pre-treating method in a thin film-forming process as defined in claim 14, wherein the liquid microparticles of the water are produced through the aerification of the supersonic vibration of the water.

16. A pre-treating method in a thin film-forming process as defined in claim 13, wherein the gas molecules of the pre-treating liquid are produced by the vaporization through the heating of a liquid selected from the group consisting of a plating liquid, an acidic liquid, an alkaline liquid and an alcohol water liquid and the liquid microparticles are produced by the aerification of a liquid selected from the group consisting of a plating liquid, an acidic liquid, an alkaline liquid and an alcohol water liquid.

17. A pre-treating method in a thin film-forming process as defined in claim 16, wherein the liquid microparticles are produced by the aerification of the supersonic vibration of a liquid selected from the group consisting of a plating liquid, an acidic liquid, an alkaline liquid and an alcohol water liquid.

18. A pre-treating method in a thin film-forming process of forming a thin film from a plating liquid on a surface of a substrate comprising the steps of:

(A) forming, on the surface of the substrate, a mask with an opening to define a thin film-forming area, (B) positioning the substrate into an atmosphere containing water microparticles produced by micronizing a water so as to have the diameters smaller than the minimum distance of the opening of the mask and thereby sticking the water microparticles on the thin film-forming area, and (C) positioning the substrate into an atmosphere containing plating liquid microparticles produced by micronizing a plating liquid so as to have the diameters smaller than the minimum distance of the opening of the mask and thereby sticking the plating liquid microparticles on the thin film-forming area.

19. A pre-treating method in a thin film-forming process of forming a thin film from a solution on a surface of a substrate comprising the steps of:

(A) forming, on the surface of the substrate on which a thin film is formed, a mask with an opening to define a thin film-forming area having a pattern corresponding to the pattern of the thin film, (B) positioning the substrate into an atmosphere containing water microparticles produced by micronizing a water so as to have at least the smaller diameters than the minimum distance of the mask pattern and thereby sticking the water microparticles on the thin film-forming area, (C) positioning the substrate into an atmosphere containing acidic liquid microparticles or alkaline liquid microparticles produced by micronizing the acidic liquid or the alkaline liquid so as to have the smaller diameters than the minimum distance of the mask pattern and thereby sticking the acidic liquid microparticles or the alkaline liquid microparticles on the thin film-forming area, and (D) positioning the substrate into an atmosphere containing water microparticles produced by micronizing a water so as to have at least the smaller diameters than the minimum distance of the mask pattern and thereby sticking the water microparticles on the thin film-forming area.

20. A pre-treating method in a thin film-forming process of forming a thin film from a solution on a surface of a substrate comprising the steps of:

(A) forming, on the surface of the substrate on which a thin film is formed, a mask with an opening to define a thin film-forming area having a pattern corresponding to the pattern of the thin film, (B) positioning the substrate into an atmosphere containing water microparticles produced by micronizing a water so as to have at least the smaller diameters than the minimum distance of the mask pattern and thereby sticking the water microparticles on the thin film-forming area, (C) positioning the substrate into an atmosphere containing acidic liquid microparticles or alkaline liquid microparticles produced by micronizing an acidic liquid or an alkaline liquid so as to have the smaller diameters than the minimum distance of the mask pattern and thereby sticking the acidic liquid microparticles or the alkaline liquid microparticles on the thin film-forming area, (D) positioning the substrate into an atmosphere containing water microparticles produced by micronizing a water so as to have at least the smaller diameters than the minimum distance of the mask pattern and thereby sticking the water microparticles on the thin film-forming area, (E) positioning the substrate into an atmosphere containing acidic liquid microparticles or alkaline liquid microparticles produced by micronizing an acidic liquid or an alkaline liquid into the smaller diameters than the minimum distance of the mask pattern and thereby sticking the acidic liquid microparticles or the alkaline liquid microparticles on the thin film-forming area, and (F) positioning the substrate into an atmosphere containing water microparticles produced by micronizing a water so as to have at least the smaller diameters than the minimum distance of the mask pattern and thereby sticking the water microparticles on the thin film-forming area.

21. A thin film-forming method of forming a given thin film pattern on a surface of a substrate comprising the steps of:

forming, on the surface of the substrate on which a thin film is formed, a mask with an opening to define a thin film-forming area having a pattern corresponding to the pattern of the thin film, producing an atmosphere containing pre-treating liquid microparticles produced by micronizing a pre-treating liquid so as to have at least the smaller diameters than the minimum distance of the mask pattern, positioning the substrate onto the atmosphere containing the pre-treating microparticles and thereby sticking the microparticles on the thin film-forming area, and forming a thin film from a solution on the thin film-forming area of the substrate which is wet with the pre-treating liquid.

22. A thin film-forming method as defined in claim 21, wherein the thin film is formed from a plating liquid on the surface of the substrate.

23. A thin film-forming method comprising the steps of:

exposing a substrate on which a thin film is formed to an atmosphere containing microparticles produced by micronizing a pre-treating liquid and thereby sticking the microparticles on a thin film-forming area on the substrate, and forming a thin film from a solution on the thin film-forming area of the substrate on which the microparticles are stuck.

* * * * *